US009136269B2

(12) United States Patent
Ahn et al.

(10) Patent No.: US 9,136,269 B2
(45) Date of Patent: Sep. 15, 2015

(54) SEMICONDUCTOR DEVICE AND METHOD OF MANUFACTURING THE SAME

(71) Applicant: SK hynix Inc., Gyeonggi-do (KR)

(72) Inventors: Jung Ryul Ahn, Gyeonggi-do (KR); Yun Kyoung Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/526,201

(22) Filed: Oct. 28, 2014

(65) Prior Publication Data
US 2015/0056779 A1 Feb. 26, 2015

(30) Foreign Application Priority Data

Aug. 30, 2011 (KR) .......................... 10-2011-0087135

(51) Int. Cl.
H01L 27/108 (2006.01)
H01L 21/02 (2006.01)
H01L 29/92 (2006.01)
H01L 23/522 (2006.01)
H01L 27/105 (2006.01)
H01L 49/02 (2006.01)
H01L 21/28 (2006.01)

(52) U.S. Cl.
CPC .... *H01L 27/10844* (2013.01); *H01L 21/28008* (2013.01); *H01L 23/5223* (2013.01); *H01L 27/105* (2013.01); *H01L 28/60* (2013.01); *H01L 28/90* (2013.01)

(58) Field of Classification Search
CPC ....... H01L 21/02; H01L 27/108; H01L 28/60; H01L 29/92; H01L 29/94
See application file for complete search history.

(56) References Cited

U.S. PATENT DOCUMENTS

2009/0014766 A1* 1/2009 Kim .............................. 257/298
2012/0168905 A1* 7/2012 Ryu ............................... 257/534
2013/0049086 A1* 2/2013 Ahn et al. ..................... 257/296
2015/0093875 A1* 4/2015 Ahn et al. ..................... 438/381

* cited by examiner

Primary Examiner — Tan N Tran
Assistant Examiner — Fazli Erdem
(74) Attorney, Agent, or Firm — IP & T Group LLP

(57) ABSTRACT

A semiconductor device includes a semiconductor substrate divided into a cell region and a peripheral circuit region defined in a first direction, wherein the peripheral circuit region is divided into a first region and a second region defined in a second direction substantially orthogonal to the first direction; gate lines formed over the semiconductor substrate in the cell region and arranged in the second direction; and a capacitor including lower electrodes over the semiconductor substrate, a dielectric layer and an upper electrode, wherein the lower electrodes in the first and second regions, separated from each other in the first direction and coupled to each other in the first region, the dielectric layer is formed along surfaces of the lower electrodes in the second region, and the upper electrode is formed over the dielectric layer.

5 Claims, 6 Drawing Sheets

Peripheral circuit region

Cell region | Peripheral circuit region

Cell region | Peripheral circuit region

Cell region | Peripheral circuit region

Peripheral circuit region

Peripheral circuit region

SEMICONDUCTOR DEVICE AND METHOD OF MANUFACTURING THE SAME

CROSS-REFERENCE TO RELATED APPLICATION

This application is a division of U.S. patent application Ser. No. 13/596,704 filed on Aug. 28, 2012, which claims priority of Korean patent application number 10-2011-0087135 filed on Aug. 30, 2011. The entire disclosure of each of the foregoing application is incorporated herein by reference in its entirety.

BACKGROUND

1. Field of Invention

Embodiments of the present invention relate to a semiconductor device and a method of manufacturing the same and, more particularly, to a semiconductor device having a capacitor and a method of manufacturing the same.

2. Description of Related Art

A semiconductor memory device includes a cell region for storing data and a peripheral circuit region for transferring a driving voltage. Memory cells, switching transistors and capacitors are provided in the cell region and the peripheral circuit region.

A capacitor is configured to accumulate electric charge. A semiconductor device may have capacitors that are arranged in a predetermined region and coupled in series or parallel with each other to obtain required capacitance. Some of conventional memory devices use a capacitor configured for a high-capacitance device rather than a low-capacitance device because those include a capacitor having the same size regardless of required capacitance. However, because a high-capacitance capacitor occupies large space, some capacitors, if not required to have a high capacitance, unnecessarily takes up space. Unnecessary space consumed in a semiconductor device may reduce an integration degree of semiconductor device, thus deteriorating area efficiency.

BRIEF SUMMARY

A low capacitance capacitor may decrease occupied area through processes to form the capacitor in a direction substantially perpendicular to a semiconductor substrate.

A semiconductor device according to an embodiment of the present invention includes a semiconductor substrate in which a cell region and a peripheral circuit region in a first direction, wherein the peripheral circuit region includes a first region and a second region defined in a second direction substantially orthogonal to the first direction, gate lines formed over the semiconductor substrate in the cell region and arranged in the second direction, and a capacitor including lower electrodes, a dielectric layer and an upper electrode over the semiconductor substrate, wherein the lower electrodes are in the first and second regions are separated from each other in the first direction and coupled to each other in the first region; the dielectric layer is formed along surfaces of the lower electrodes in the second region; and the upper electrode is formed over the dielectric layer.

The lower electrodes include first conductive layer patterns formed over the semiconductor substrate in the first region and the second region and separated from each other in the first direction, and a third conductive layer electrically coupling the first conductive layer patterns to each other in the first region. The first conductive layer patterns are formed of dope polysilicon.

The upper electrode comprises a second conductive layer and a metal layer formed over the dielectric layer in the second region. The second conductive layer is formed of doped polysilicon.

The metal layer is formed of tungsten (W), tungsten silicide (WSix), aluminum (Al) or titanium (Ti).

A semiconductor device according to another embodiment of the present invention includes a semiconductor substrate in which a cell region and a peripheral circuit region defined in a first direction, wherein the peripheral circuit region includes a first region and a second region defined in a second direction substantially orthogonal to the first direction; isolation layers formed in the semiconductor substrate in the cell region and the peripheral circuit region and separated from each other in the first direction, wherein portions of the isolation layers protrude upward from the semiconductor substrate; gate insulating layer patterns separated from each other over the semiconductor substrate between the isolation layers in the cell region, and formed in the first direction over the semiconductor substrate between the isolation layers in the peripheral circuit region; first conductive layer patterns formed over the gate insulating layer patterns in the cell region and the peripheral circuit region; a dielectric layer formed in the second direction along surfaces of the first conductive layer patterns and the isolation layers in the cell region, and formed along surfaces of the first conductive layer patterns and the isolation layers in the second region; a second conductive layer formed over the dielectric layer in the cell region and the second region; and a third conductive layer formed to electrically couple the first conductive layer patterns to each other in the first region, wherein a capacitor includes lower electrodes, which are formed of the third conductive layer in the first region and the first conductive layer patterns in the first and second regions, and an upper electrode formed of the second conductive layer in the second region.

The first conductive layer patterns are formed of a doped polysilicon layer. The second conductive layer comprises a doped polysilicon layer and a metal layer stacked.

The dielectric layer comprises an oxide layer, a nitride layer and an oxide layer sequentially stacked or is formed of a high-k material. The high-k material includes one of $Al_2O_3$, $HfO_x$ and TiO.

A method of manufacturing a semiconductor device according to an embodiment of the present invention includes defining a cell region and a peripheral circuit region in a first direction in a semiconductor substrate and defining a first region and a second region in a second direction substantially orthogonal to the first direction in the peripheral circuit region; forming a gate insulating layer and a first conductive layer sequentially over the semiconductor substrate; forming trenches separating patterns of the gate insulating layer and patterns of the first conductive layer by partially removing the first conductive layer, the gate insulating layer and the semiconductor substrate from the cell region and the peripheral circuit region; forming isolation layers by partially filling the trenches with an insulating material and forming recesses in top portions of the isolation layers to partially expose sidewalls of the patterns of the first conductive layer; forming a dielectric layer along a surface of an entire structure including the isolation layers; forming a second conductive layer over the dielectric layer to fill the recesses; forming gate lines arranged in the second direction in the cell region by partially removing the second conductive layer, the dielectric layer, the patterns of the first conductive layer and the patterns of the gate insulating layer from the cell region; exposing the patterns of the first conductive layer by removing the second conductive layer and the dielectric layer from the first region;

and forming a third conductive layer to electrically couple the patterns of the first conductive layer exposed at the first region and forming a capacitor including lower electrodes and an upper electrode, wherein the patterns of the first conductive layer and the third conductive layer become the lower electrodes and the second conductive layer in the second region becomes the upper electrode.

The first conductive layer comprises a doped polysilicon layer. The second conductive layer is formed by stacking a doped polysilicon layer and a metal layer.

The metal layer is formed of tungsten (W), tungsten silicide (WSix), aluminum (Al) or titanium (Ti).

The dielectric layer is formed by sequentially stacking an oxide layer, a nitride layer and an oxide layer or is formed of a high-k material. The high-k material is formed of $Al_2O_3$, $HfO_x$ or TiO.

A semiconductor memory device includes gate lines configured to function as a word line in a cell region; lower electrodes in a peripheral region, each having the same structure with each of the gate lines; a conductive pattern configured to connect the lower electrodes to each other; an upper electrode configured to function as one of two electrodes of a capacitor in the peripheral region; and a dielectric layer configured to insulate the lower electrodes and the upper electrode in the peripheral region, wherein the lower electrodes and the conductive pattern function as the other of the two electrodes of the capacitor.

The semiconductor memory device further comprises an isolation layer located between the gate patterns to separate the gate patterns from each other, and between the lower electrode patterns to separate the lower electrode patterns from each other.

The gate pattern and the lower electrode pattern includes a doped polysilicon layer, while the upper electrode includes one of tungsten (W), tungsten silicide (WSix), aluminum (Al), and titanium (Ti). The layer includes one of Al2O3, HfOx, TiO, and stacked layers of oxide, nitride, and oxide.

DESCRIPTION OF EMBODIMENTS

Hereinafter, various embodiments of the present disclosure will be described in detail with reference to the accompanying drawings. The figures are provided to enable those of ordinary skill in the art to make and use the present invention according to the exemplary embodiments of the present invention.

FIGS. 1A to 1F are cross-sectional views illustrating a method of manufacturing a capacitor according to an embodiment of the present invention.

Figure 1A:
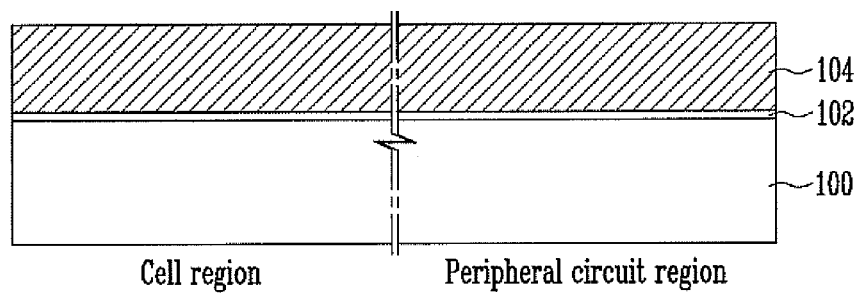
FIGS. 1A to 1F are cross-sectional views illustrating a method of manufacturing a capacitor according to an embodiment of the present invention.

Referring to FIG. 1A, a cell region and a peripheral circuit region are defined in a first direction in a semiconductor substrate 100. The peripheral circuit region includes a first region and a second region in a second direction that is substantially orthogonal to the first direction. A gate insulating layer 102 and a first conductive layer 104 for a floating gate are sequentially stacked over the semiconductor substrate 100. Lower electrodes may be formed in the first region and the second region; an upper electrode and the lower electrodes may overlap with each other in the second region. The gate insulating layer 102 may comprise an oxide layer. The first conductive layer 104 may be formed of doped polysilicon. Since the first conductive layer 104 functions as a floating gate at the cell region and an electrode at the peripheral circuit region, the first conductive layer 104 may have a thickness of 10 nm or more.

Figure 1B:
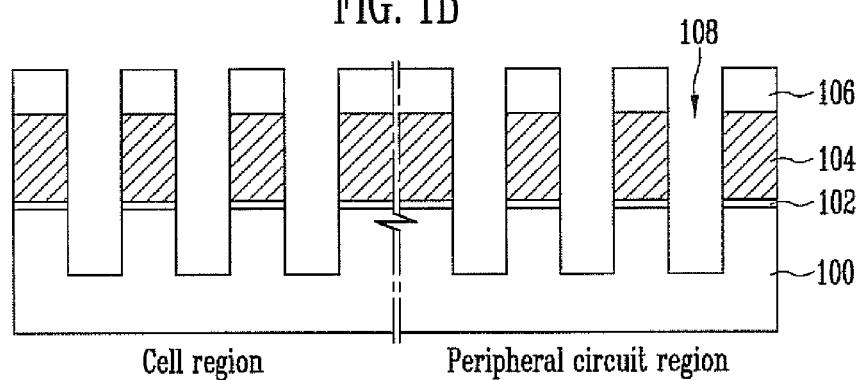

Referring to FIG. 1B, a hard mask 106 may be formed over the first conductive layer 104. The hard mask 106 has openings at portions corresponding to isolation regions. The first conductive layer 104 is partially exposed through the openings of the hard mask 106. The exposed portions of the first conductive layer 104 are selectively etched; and portions of the gate insulating layer 102 are exposed by the etched first conductive layer 104. Then, the gate insulating layer 102 and the semiconductor substrate 100 are sequentially removed to thus form trenches 108, patterns of the gate insulating layer 102 and patterns of the first conductive layer 104.

In the cell region, a width of each trench 108 may depend on an integration degree of the semiconductor device. However, each of the trenches 108 at the peripheral circuit region may have a thickness of 1 nm or more in order to ensure minimum capacitance. After the trenches 108 are formed, a wall insulating layer (not shown) may be further formed to recover surface damages that may occur during an etch process.

Figure 1C:
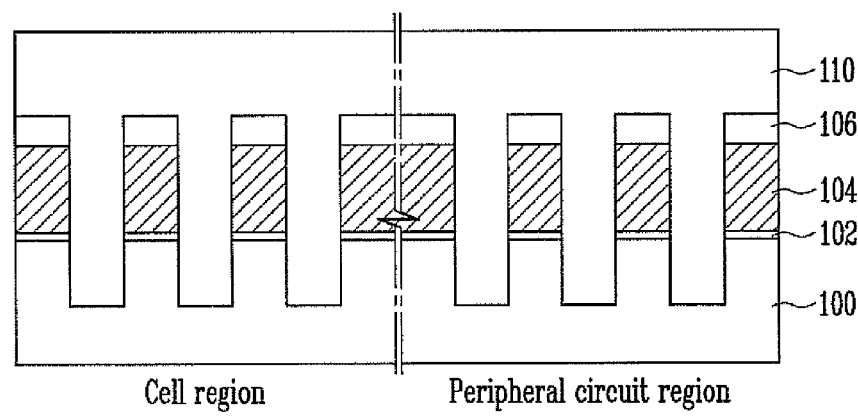

Referring to FIG. 1C, an insulating layer for isolation layers 110 is formed over the entire structure to fill the trenches 108. Here, the insulating layer may be formed of an oxide layer. For example, the insulating layer may comprise a high density plasma (HDP) oxide layer, or a flowable insulating layer (SOD layer) and an HDP oxide layer that are stacked.

Figure 1D:
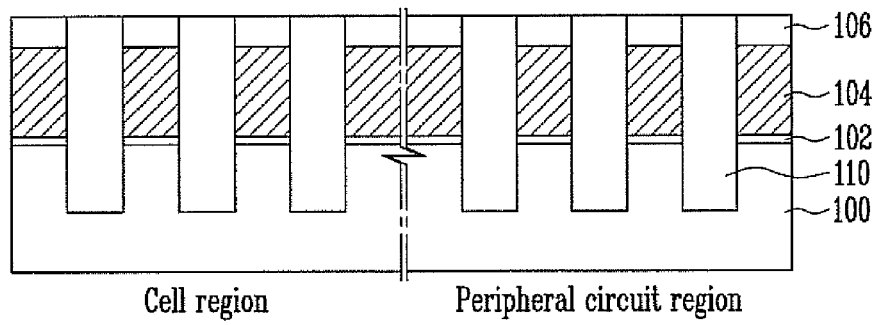

Referring to FIG. 1D, a planarization process is performed to expose the hard mask 106. Here, chemical mechanical polishing (CMP) may be performed as the planarization process. As a result, the isolation layers 110 may remain only in the trenches 108.

Figure 1E:
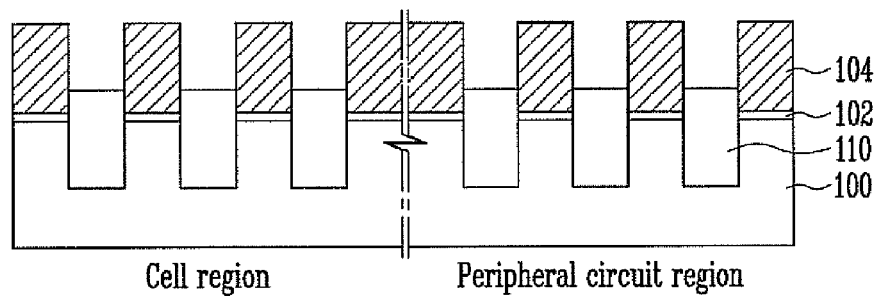

Referring to FIG. 1E, after the hard mask 106 is removed, a height of each isolation layers 110 is reduced to enhance coupling between a control gate CG and a floating gate FG to be formed in subsequent processes. An effective field height (EFH) may be controlled by reducing the height of each isolation layer 110 through an etch process. While the heights of the isolation layers 110 are reduced, the patterns of the gate insulating layer 102 should not be exposed.

Figure 1F:
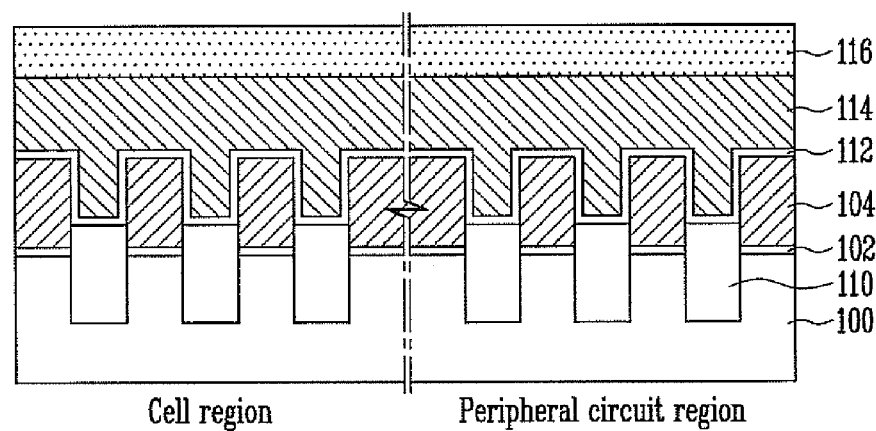

Referring to FIG. 1F, a dielectric layer 112 is formed along exposed surfaces of the isolation layers 110 and the patterns of the first conductive layer 104. The patterns of the first conductive layer 104 are exposed above the isolation layers 110. The dielectric layer 112 may include a high-k material or a stacked structure of an oxide layer, a nitride layer, and an oxide layer. For example, the high-k material may be formed of $Al_2O_3$, $HfO_x$, or TiO. After the dielectric layer 112 is formed, a second conductive layer (114 and 116) for a control gate is formed over the dielectric layer 112.

The second conductive layer (114 and 116) may comprise a doped polysilicon layer 114 and a metal layer 116. Here, the metal layer 116 is formed over the doped polysilicon layer 114 to reduce resistance. The metal layer 116 includes a metal such as tungsten (W), tungsten silicide (WSix), aluminum (Al), or titanium (Ti). Subsequently, a gate line forming process is performed to form gate lines in the cell region. The gate lines are formed in the cell region, not the peripheral circuit region. The cell region and the peripheral circuit region, after the gate line forming process is performed, are described below in detail with reference to the following drawings.

Figure 2:
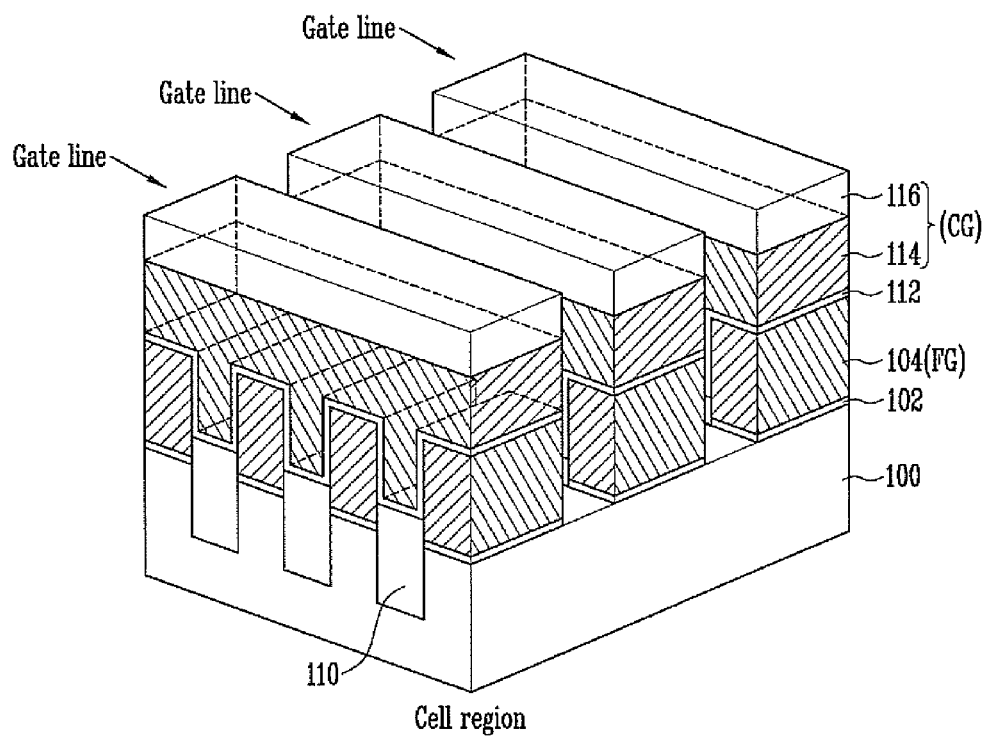
FIG. 2 is a three-dimensional view of a cell region after a gate line is formed.

FIG. 2 is a three-dimensional view of the cell region after the gate line is formed. As shown in FIG. 2, a plurality of gate lines is formed in the cell region by performing the gate line forming process. Each of the gate lines may include the insulating layer 102, the floating gate FG, the dielectric layer 112, and the control gate CG.

Figure 3:
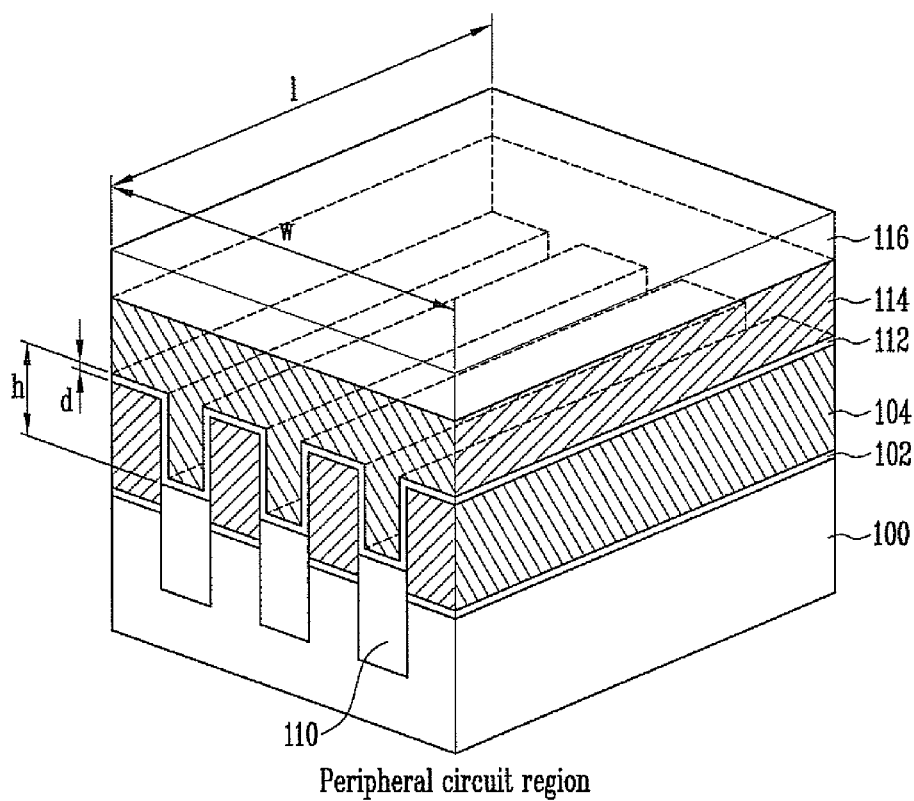
FIG. 3 is a three-dimensional view of a peripheral circuit region after a gate line is formed.

FIG. 3 is a three-dimensional view of the peripheral circuit region after the gate line is formed. As shown in FIG. 3, a gate line is not formed in the peripheral circuit region while the gate lines are formed only in the cell region. In the peripheral circuit region, the floating gate FG in the cell region becomes a lower electrode, and the control gate CG in the cell region becomes an upper electrode. Therefore, in the peripheral circuit region, a capacitor includes lower electrodes formed of the patterns of the first conductive layer 104, an upper electrode formed of the second conductive layer (114 and 116), and the dielectric layer 112 interposed between the lower electrodes and the upper electrode. Capacitance of the capacitor may satisfy the following equation:

$$C = E\frac{wlh}{d} \quad \text{[Equation 1]}$$

In Equation 1, C is the capacitance, E is the dielectric constant, 'w' is the width of the capacitor, 'l' is the length of the capacitor, and 'd' is the thickness of the dielectric layer. Since the capacitor having a three-dimensional structure as shown in FIG. 3 has a height 'h' greater than that of a conventional two-dimensional capacitor, sufficient capacitance may be ensured despite a decrease of occupied area.

A conductive layer (or contact plug) that transfers voltage to the lower electrodes or the upper electrode is to be formed to operate the capacitor. Specifically, a third conductive layer may come into contact with the lower electrodes, and a fourth conductive layer may come into contact with the upper electrode. The third and fourth conductive layers may be coupled to different nodes. The third and fourth conductive layers may have various configurations. Embodiments of the capacitor having the third and fourth conductive layers are described below with reference to the following drawings.

Figure 4:
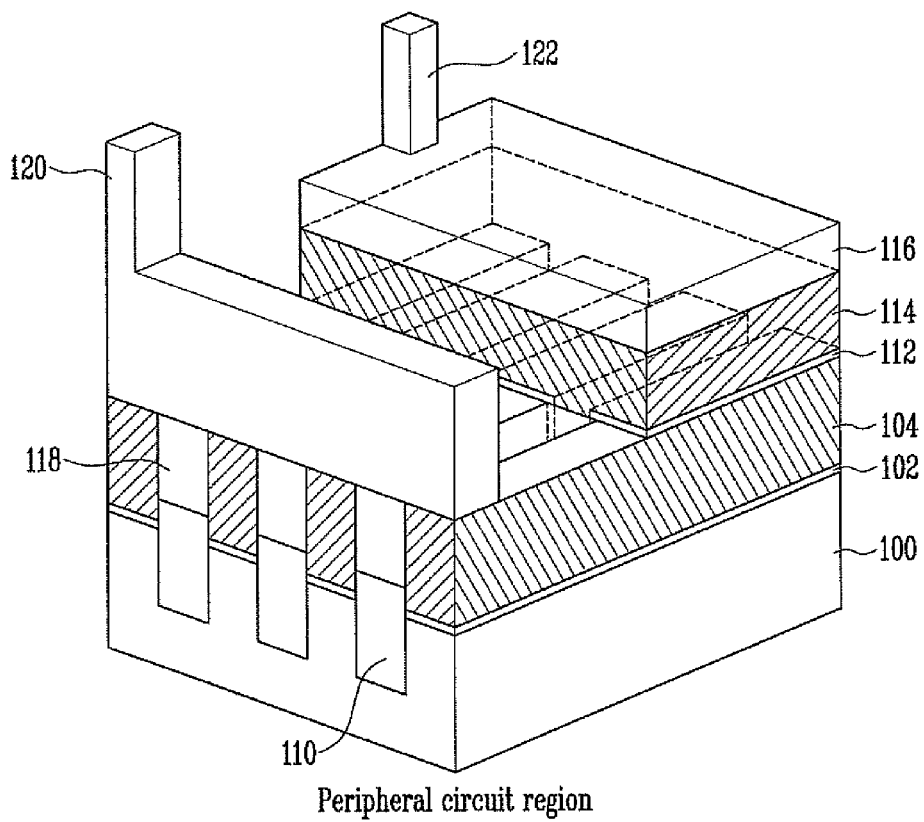
FIG. 4 is a three-dimensional view of a capacitor according to an embodiment of the present invention.

FIG. 4 is a three-dimensional view of a capacitor according to an embodiment of the present invention.

Referring to FIG. 4, the second conductive layer (114 and 116) and the dielectric layer 112 are removed from the first region to expose the patterns of the first conductive layer 104. Here, the second conductive layer (114 and 116) between the patterns of the first conductive layer 104 is completely removed from the first region at which the dielectric layer 112 is exposed. Subsequently, an interlayer insulating layer 118 fills between the exposed patterns of the first conductive layer 104. A third conductive layer 120 is formed to electrically couple the exposed patterns of the first conductive layer 104 to each other. A fourth conductive layer 122 is formed on top of the metal layer 116 in the second region.

The third conductive layer 120 may be formed in various methods. For example, after a conductive layer may be formed over the interlayer insulating layer 118 and the patterns of the first conductive layer 104 exposed in the first region, a portion of the conductive layer which adjoins the second region may be removed to form the third conductive layer 120 that does not contact with the second region. In this manner, the capacitor is formed such that the patterns of the first conductive layer 104 and the third conductive layer 120 become the lower electrodes of the capacitor; the second conductive layer (114 and 116) becomes the upper electrode of the capacitor; and the dielectric layer 112 in the second region becomes an insulating material interposed between the lower electrodes and the upper electrode. Subsequent processes may be performed to couple the third conductive layer 120 and the fourth conductive layer 122 to different nodes.

Figure 5:
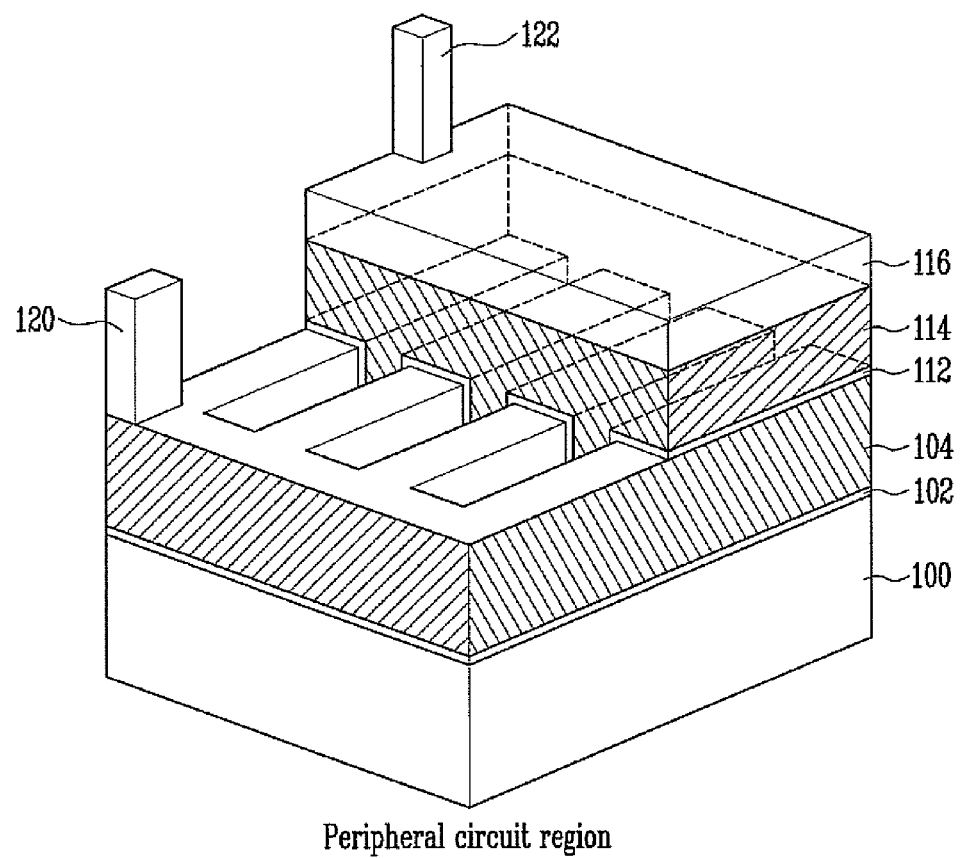
FIG. 5 is a three-dimensional view of a capacitor according to another embodiment of the present invention.

FIG. 5 is a three-dimensional view of a capacitor according to another embodiment of the present invention.

Referring to FIG. 5, when the trenches 108 are formed as shown in FIG. 1B, ends of the patterns of the first conductive layer 104 for the lower electrodes may be coupled to each other in the first region of the peripheral circuit region. Subsequently, the aforementioned processes described in connection with FIGS. 1C to 1F are performed. The second conductive layer (114 and 116) is removed from the first region to expose the dielectric layer 112 in the first region. Here, the second conductive layer (114) between the patterns of the first conductive layer 104 is completely removed from the first region at which the dielectric layer 112 is exposed.

Subsequently, the exposed dielectric layer 112 is removed to expose the patterns of the first conductive layer 104. The third conductive layer 120 is formed to electrically couple the exposed patterns of the first conductive layer 104 to each other. The fourth conductive layer 122 is subsequently formed on top of the metal layer 116 in the second region. In this manner, the third conductive layer 120 is coupled to the first conductive layer 104 for the lower electrodes of the capacitor. The fourth conductive layer 122 is coupled to the metal layer 116 for the upper electrode of the capacitor.

In the aforementioned embodiments of the present invention, the third and fourth conductive layers 120 and 122 are formed in a direction substantially perpendicular to the semiconductor substrate 100. However, the present invention is not limited thereto. The third and fourth conductive layers 120 and 122 may be arranged in a horizontal direction against the semiconductor substrate 100.

As described above, the area of a capacitor for low capacitance may be reduced because the capacitor is formed in a direction substantially perpendicular to a semiconductor substrate. Since the capacitor is formed at the same time as a gate line is formed, an increase in the number of manufacturing processes may be avoided. In addition, a height of lower electrode may be determined in proportion to a height of floating gate in a cell region. Sufficient capacitance of the capacitor may be ensured because of an increased height, even if a two-dimensional flat area decreases. Accordingly, the size of a semiconductor device that has the low capacitance capacitor of the embodiment may be reduced.

According to embodiments of the present invention, the area of a capacitor for low capacitance may be reduced by forming the capacitor in a direction substantially perpendicular to a semiconductor substrate, and a capacitor for low capacitance may be manufactured without an additional process by forming the capacitor at the same time as a gate line forming process is performed.

What is claimed is:

1. A method of manufacturing a semiconductor device, the method comprising:
    defining a cell region and a peripheral circuit region in a first direction in a semiconductor substrate and defining a first region and a second region in a second direction substantially orthogonal to the first direction in the peripheral circuit region;
    forming a gate insulating layer and a first conductive layer sequentially over the semiconductor substrate;

forming trenches separating patterns of the gate insulating layer and patterns of the first conductive layer by partially removing the first conductive layer, the gate insulating layer and the semiconductor substrate from the cell region and the peripheral circuit region;

forming isolation layers by partially filling the trenches with an insulating material and forming recesses in top portions of the isolation layers to partially expose sidewalls of the patterns of the first conductive layer;

forming a dielectric layer along a surface of an entire structure including the isolation layers;

forming a second conductive layer over the dielectric layer to fill the recesses;

forming gate lines arranged in the second direction in the cell region by partially removing the second conductive layer, the dielectric layer, the patterns of the first conductive layer and the patterns of the gate insulating layer from the cell region;

exposing the patterns of the first conductive layer by removing the second conductive layer and the dielectric layer from the first region; and forming a third conductive layer to electrically couple the patterns of the first conductive layer exposed at the first region and forming a capacitor including lower electrodes and an upper electrode, wherein the patterns of the first conductive layer and the third conductive layer become the lower electrodes and the second conductive layer in the second region becomes the upper electrode.

2. The method of claim 1, wherein the first conductive layer comprises a doped polysilicon layer.

3. The method of claim 1, wherein the second conductive layer is formed by stacking a doped polysilicon layer and a metal layer.

4. The method of claim 3, wherein the metal layer is formed of one of tungsten (W), tungsten silicide (WSix), aluminum (Al), and titanium (Ti).

5. The method of claim 1, wherein the dielectric layer is formed in one of a sequentially stacked structure, including an oxide layer, a nitride layer and an oxide layer, and a high-k material.

* * * * *